(12) United States Patent  
Ameen et al.

(10) Patent No.: US 6,224,722 B1
(45) Date of Patent: May 1, 2001

(54) METHOD AND APPARATUS FOR SEQUENTIALLY METALIZING POLYMERIC FILMS AND PRODUCTS MADE THEREBY

(75) Inventors: Thomas J. Ameen, Mentor; Robert D. DeWitt, Highland Heights; Peter Peckham, Painesville; Ronald K. Haines, Mentor; Adam G. Bay, Chesterland, all of OH (US)

(73) Assignee: Gould Electronics Inc., Eastlake, OH (US)

( * ) Notice: Subject to any disclaimer, the term of this patent is extended or adjusted under 35 U.S.C. 154(b) by 0 days.

(21) Appl. No.: 09/276,392

(22) Filed: Mar. 25, 1999

Related U.S. Application Data

(63) Continuation of application No. 08/925,220, filed on Sep. 8, 1997, now Pat. No. 5,944,965, which is a continuation of application No. 08/604,450, filed on Feb. 4, 1996, now Pat. No. 5,716,502, which is a division of application No. 08/515,910, filed on Aug. 16, 1995, now Pat. No. 5,685,970, which is a continuation-in-part of application No. 08/347,850, filed on Dec. 1, 1994, now abandoned, which is a continuation of application No. 08/098,440, filed on Jul. 27, 1993, now abandoned, which is a continuation of application No. 07/907,066, filed on Jul. 1, 1992, now abandoned.

(51) Int. Cl.[7] .................................................. C25D 17/10
(52) U.S. Cl. ..................................... 204/290.12; 204/288
(58) Field of Search ................................ 204/290 R, 288

(56) References Cited

U.S. PATENT DOCUMENTS

| Re. 32,078 | 2/1986 | Woodward, Jr. et al. . |
|---|---|---|
| 740,359 | 9/1903 | Fletcher . |
| 3,483,113 | 12/1969 | Carter . |
| 3,793,159 | 2/1974 | Wells . |
| 3,857,774 | 12/1974 | Morton et al. . |
| 3,868,229 | 2/1975 | Hurley . |

(List continued on next page.)

FOREIGN PATENT DOCUMENTS

0 254 703    1/1988   (EP) .

Primary Examiner—Kishor Mayekar
(74) Attorney, Agent, or Firm—Mark Kusner; Michael A. Centanni

(57) ABSTRACT

An electrolytic cell comprised of a tank for holding electrolytic solution, and a drum rotatable about a horizontal axis having a non-conductive cylindrical outer surface disposed within the tank, and a plurality of elongated, like anodes arranged about the outer surface of the drum. The anodes together form a generally continuous cylindrical surface spaced from, and generally conforming to, the outer surface of the drum. Each of the anodes has at least one end projecting through the tank. A plurality of power sources is provided together with connection means for connecting groups of one or more of the projecting ends of the anodes to each power source.

4 Claims, 9 Drawing Sheets

U.S. PATENT DOCUMENTS

| | | |
|---|---|---|
| 3,901,785 | 8/1975 | Buzhinskaya et al. . |
| 3,918,927 | 11/1975 | Wells . |
| 3,956,077 | 5/1976 | Hamby, Jr. et al. . |
| 3,959,564 | 5/1976 | Heymann et al. . |
| 3,963,590 | 6/1976 | Deyrup . |
| 4,035,227 | 7/1977 | Doty et al. . |
| 4,039,714 | 8/1977 | Roubal et al. . |
| 4,148,945 | 4/1979 | Bangs et al. . |
| 4,193,849 | 3/1980 | Sato . |
| 4,241,129 | 12/1980 | Marton et al. . |
| 4,318,794 | 3/1982 | Adler . |
| 4,322,280 | 3/1982 | Houska et al. . |
| 4,374,717 | 2/1983 | Drauglis et al. . |
| 4,411,762 * | 10/1983 | Kline ................................ 204/290 F |
| 4,490,218 | 12/1984 | Kadija et al. . |
| 4,510,208 | 4/1985 | Kurfman . |
| 4,563,253 | 1/1986 | Leidheiser, Jr. et al. . |
| 4,576,685 | 3/1986 | Goffredo et al. . |
| 4,612,216 | 9/1986 | Kurfman . |
| 4,642,173 * | 2/1987 | Koziol et al. ........................ 204/288 |
| 4,666,739 | 5/1987 | Roubal . |
| 4,673,469 | 6/1987 | Beach et al. . |
| 4,683,036 | 7/1987 | Morrissey et al. . |
| 4,778,571 | 10/1988 | Nakatsagawa . |
| 4,790,912 | 12/1988 | Holtzman et al. . |
| 4,810,333 | 3/1989 | Gulla et al. . |
| 4,858,073 | 8/1989 | Gregory . |
| 4,869,789 | 9/1989 | Kurze et al. . |
| 4,869,798 | 9/1989 | Kamps et al. . |
| 4,895,739 | 1/1990 | Bladon . |
| 4,897,164 | 1/1990 | Piano et al. . |
| 4,898,647 | 2/1990 | Luce et al. . |
| 4,919,768 | 4/1990 | Bladon . |
| 4,952,286 | 8/1990 | Bladon et al. . |
| 5,015,339 | 5/1991 | Pendleton . |
| 5,017,275 | 5/1991 | Niksa et al. . |
| 5,100,518 | 3/1992 | Fuchs et al. . |
| 5,228,965 | 7/1993 | Ameen et al. . |
| 5,242,562 | 9/1993 | Beyerle et al. . |
| 5,344,538 | 9/1994 | Chamberlain et al. . |
| 5,393,396 | 2/1995 | DeWitt et al. . |
| 5,429,738 | 7/1995 | Beyerle et al. . |
| 5,681,443 | 10/1997 | Ameen et al. . |
| 5,685,970 | 11/1997 | Ameen et al. . |
| 5,716,502 | 2/1998 | Ameen et al. . |

\* cited by examiner

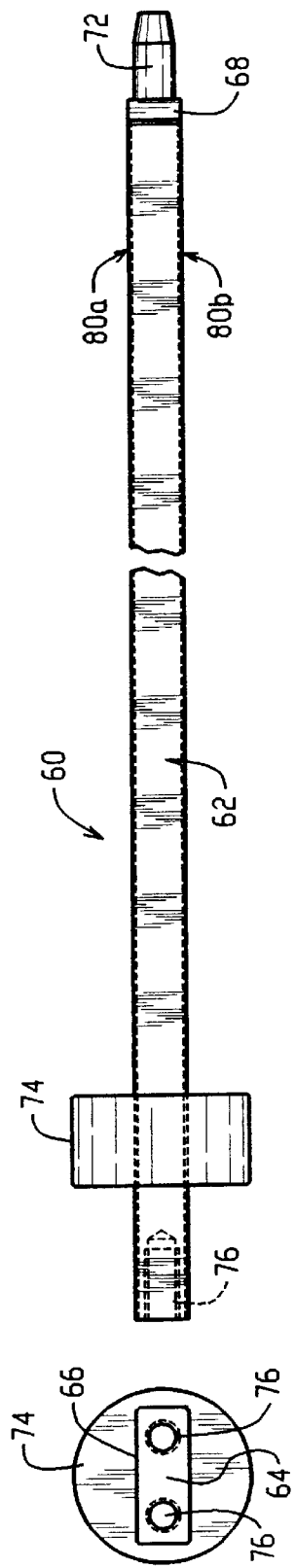
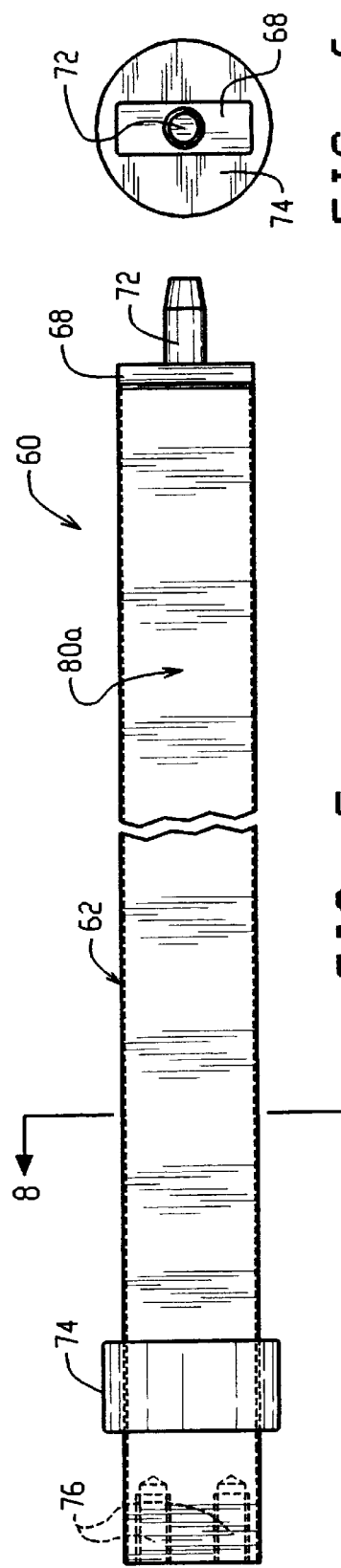

METHOD AND APPARATUS FOR SEQUENTIALLY METALIZING POLYMERIC FILMS AND PRODUCTS MADE THEREBY

This application is a continuation of application Ser. No. 08/925,220 filed on Sep. 8, 1997, now U.S. Pat. No. 5,944,965, which is a continuation of U.S. application Ser. No. 08/604,450 filed on Feb. 4, 1996, now U.S. Pat. No. 5,716,502, which is a division of Ser. No. 08/515,980 filed Aug. 16, 1995, now U.S. Pat. No. 5,685,970 which is a continuation-in-part (CIP) of U.S. application Ser No. 08/347,850 filed Dec. 1, 1994, now abandoned, which is a continuation of U.S. application Ser. No. 08/098,440 filed Jul. 27, 1993, now abandoned, which is a continuation of U.S. application Ser. No. 07/907,066 filed Jul. 1, 1992, now abandoned.

BACKGROUND OF THE INVENTION

1. Field of the Invention

The present invention relates to the electrodeposition of metal, and more particularly to the metallization of flexible polymer sheets. The invention is particularly applicable to a process and apparatus for electroplating a metal layer onto a non-metallic electrically insulating substrate with a flash of metal adhered thereon.

2. State of the Art

The electrodeposition of metals from an aqueous solution is well known in the art. Simply stated, the process involves the use of a cathode, an anode (collectively called "electrodes"), an aqueous solution containing ions of the metal to be electrodeposited and an external current source. As electrical current is furnished to the anode, the metal ions are reduced and electrodeposited from the aqueous solution. Practically any metal which can be solvated by water (typically metallic salts) can be electrodeposited by the above-defined apparatus.

Electrodeposited copper is used widely in the electronics industry. Traditionally, copper is electrodeposited in rolls, cut to sheets and bonded to polymeric boards and etched. Then, discrete electronic parts are attached to the circuit board and the circuit board is inserted into an apparatus or device.

When the non-metallic, electrically insulating substrate is a flexible polymeric sheet, the metal, such as copper, may be electrodeposited directly on a flash of metal which has been sputtered, vapor deposited, electrolessly deposited, or adhered by similar techniques on the flexible polymeric substrate. Such an approach obviates the need for the intermediate step of bonding a metal foil to the substrate. The flexible polymeric sheet may be pretreated prior to depositing the flash of metal thereon. Once the polymer is initially metallized, metal may be electrodeposited on the metal flash yielding thicknesses of electrodeposited metal up to conventional thicknesses, i.e. of from about 0.25 oz. to about 2 oz. (corresponding to thicknesses of about 0.3 mils to about 2.8 mils of electrodeposited metal).

The resulting flexible, metal coated polymeric films find utility in flex circuits, tape automated bonding, electromagnetic interference shielding and other fields where metalized substrates are useful.

The following U.S. patents describe inventions relating to the metallization of polymers and other such non-metals.

Morrissey et al., U.S. Pat. No. 4,683,036, describe a method of electroplating a nonconductive substrate utilizing a photoresist and the reductive capacity of hydrogen in the presence of a metallic catalyst, the catalyst located on the substrate to be coated with metal.

Pian et al., U.S. Pat. No. 4,897,164, describe a method of electroplating the walls of through holes in laminated printing boards.

Bladon, U.S. Pat. No. 4,919,768, describes a method of electroplating an article of manufacture.

Pendleton, U.S. Pat. No. 5,015,339, describes a method of electroplating a metal layer to the surface of a nonconductive material.

Bladon et al., U.S. Pat. No. 4,952,286, describe a method for plating the surface of a nonconducting article.

Beach et al., U.S. Pat. No. 4,673,469, describe a method and an apparatus for depositing metal on articles involving initially an autocatalytic process followed by an electroplating step.

Houska et al., U.S. Pat. No. 4,322,280, describe an electrolytic device for the electrodeposition of a metal on at least one surface of a tape which has been previously coated with a metal on that surface.

Goffredo et al., U.S. Pat. No. 4,576,685, describe a process and apparatus for the deposition of metal on generally flat surfaces through an electroless deposition process followed by an electrodeposition process.

Deyrup, U.S. Pat. No. 3,963,590, describes a process of pre-etching, etching, neutralizing and treating the surface of polyoxymethylene for electroless deposition of a metal followed by an electroplating step.

Conventional electrodeposition methods for copper on flexible polymeric sheets use current densities of from about twenty-five to about fifty amps per square foot. These current densities result in lengthy deposition times especially when thicknesses of greater than one mil of copper are desired. In this respect, the typical amount of electrodeposited copper on flexible polymeric sheets is typically referred to in "ounces." One ounce is the weight of copper for a one square foot of copper sheet (this represents a thickness of, on the average, 1.35 mils of copper). With conventional electrodeposition methods known heretofore, about forty to sixty minutes is required to electrodeposit one ounce of copper onto one square foot of a flexible polymeric sheet.

The rate of metal deposition in such an electrodeposition process is basically dependant upon the current which can be applied to the metal on the polymer substrate, which metal in effect becomes a conductor for the current. In one respect, the current to the web is limited by the thickness of the metal on the substrate, as well as by the current-carrying characteristics of the metal on the substrate. In another respect, the current applied to the metal substrate is determined by the anode design and arrangement, particularly the current density which can be generated at the anode surface(s) and the power loss in heat generated during the electrodeposition process.

Methods and apparatuses known heretofore are generally limited because of their designs in the amount of current which can be applied to the polymeric substrate and are limited in another respect in that the current applied to the substrate is based upon the thickness of initial metal flash on the substrate.

The present invention overcomes the limitations of apparatus known heretofore, and provides a method and apparatus for electrodepositing a metal onto a non-metallic, electrically insulating substrate, which apparatus and method dramatically reduce the electrodeposition time by reducing the gap between the active anode surfaces and the moving substrate thereby reducing the thermal power loss through a reduction of voltage, by increasing the current density which can be applied to the active anode surfaces, and by utilizing the current carrying capacity of the deposited metal to facilitate application of higher current to the substrate.

SUMMARY OF THE INVENTION

In accordance with one aspect of the present invention, there is provided an electrolytic cell comprised of a tank for holding electrolytic solution, a drum rotatable about a horizontal axis having a non-conductive cylindrical outer surface disposed within the tank, and a plurality of elongated, like anodes arranged about the outer surface of the drum. The anodes together form a generally continuous cylindrical surface spaced from, and generally conforming to, the outer surface of the drum. Each of the anodes has at least one end projecting through the tank. A plurality of power sources is provided together with connection means for connecting groups of one or more of the projecting ends of the anodes to each power source.

In accordance with another aspect of the present invention, there is provided an apparatus for electrodepositing metal comprised of a tank for holding electrolytic solution, a drum mounted within the tank, and a plurality of elongated, like anodes arranged side-by-side within the tank about the drum. Each of the anodes has at least one end extending through the tank for connection to an electrical power source and at least two distinct active anode surfaces extending along the length of the anodes. The anodes are mounted to the tank wherein one of the at least two distinct active anode surfaces is positioned facing the drum.

In accordance with another aspect of the present invention, there is provided an apparatus for electroplating a metal onto a non-metallic electrically insulating substrate having a flash metal layer thereon. The apparatus includes a tank for holding an electrolyte having a concentration of metal ions to be deposited. A cylindrical drum is mounted within the tank. The drum has a nonconductive outer surface and is rotatable about a fixed axis to pass the substrate through the tank. A plurality of elongated anodes are mounted to the tank and arranged side-by-side about the nonconductive outer surface of the drum. Each of the anodes extends along an axis generally parallel to the axis of the drum and has an uniform transverse cross-section defining at least two active anode surfaces. The anodes are mounted to the tank, wherein one of the at least two active anode surfaces of each anode faces the drum and is aligned with adjacent anodes to define a generally continuous active anode forming surface circumjacent to the drum. The active anode forming surface defines a gap of generally uniform thickness with the outer surface of the drum. At least one power source is connected to the anodes. A cathode member outside the tank engages the metal portion of the substrate as it exits the tank.

In accordance with another aspect of the present invention, there is provided an electrolytic cell for electrodepositing metal onto a substrate having a metal layer thereon. The cell is comprised of a tank for holding electrolytic solution, a non-conductive curved flat surface within the tank defining a path along which the substrate moves, and a plurality of elongated, like anodes each having a uniform transverse prismatic cross-section defining at least two active anode surfaces. Each anode is mounted within the tank wherein one of the at least two active anode surfaces faces the non-conductive surface of the drum and wherein a portion of the anode extends through the tank. The anodes are closely arranged side-by-side to define a generally continuous uniform gap between the non-conductive surface of the drum and the active anode surfaces of the anodes. Connector means connect groups of one or more adjacent anodes to separate power sources. A cathode member outside the tank engages the metal portion of the substrate as it exits the tank.

In accordance with another aspect of the present invention, there is provided a method of electrodepositing a metal onto a non-metallic electrically insulating substrate, comprising the steps of:

providing a plurality of elongated anodes side-by-side in a close-packed array in an electrolytic solution, each anode having an active anode surface aligned with the active anode surfaces of adjacent anodes to form a generally continuous active forming surface;

moving a thin flash of metal having a non-conductive backing thereon through the electrolytic solution and along the continuous active forming surface while maintaining the uniform spacing between the metal and the forming surface of less than one inch as it passes therealong;

passing the metal as it exits the electrolytic solution over a cathode pick-up outside the electrolytic solution; and electrically energizing groups of one or more adjacent anodes, each successive group of the anodes having a higher energization level than the preceding group.

In accordance with another aspect of the present invention, there is provided a method for electroplating a metal onto a non-metallic electrically insulating substrate, comprising the steps of:

a) depositing a thin flash of metal onto one side of a non-metallic electrically insulating substrate;

b) passing the substrate in a predetermined direction along a path defined by a non-conductive surface with the metal side of the substrate facing away from the surface, the non-conductive surface being disposed within an electrolytic solution, and having a plurality of anodes facing and positioned adjacent thereto to define a uniform gap therewith, each of the anodes being separately chargeable by a power source wherein groups comprising one or more adjacent anodes can be charged with different current levels;

c) passing the metal side of the substrate over an electrically conductive cathode outside the electrolytic solution; and d) causing each group of electrodes to have a different level of current density as the substrate passes through the electrolytic solution to continuously electrodeposit metal on the electrically-conducted substrate.

In accordance with another aspect of the present invention, there is provided a method of electrodepositing a metal onto a non-metallic electrically insulating substrate, comprising the steps of:

a) moving an electrically non-conductive substrate having a metal flash thereon along a predetermined path wherein the substrate is first moved through an electrolytic solution past a plurality of anodes disposed in the solution and then over a conductive cathode surface outside the electrolytic solution, the metal flash on the substrate facing the anodes in the solution and engaging the conductive cathode surface; and b) electrically energizing groups of one or more adjacent anodes at different levels wherein each successive group of anodes has a higher energization level than the preceding group.

In accordance with another aspect of the present invention, there is provided a method of forming a printed circuit on a non-metallic electrically insulating substrate, comprising the steps of:

a) printing a plating resist onto an electrically conductive layer of material on one side of an elongated strip of a flexible nonconductive material to leave exposed an exposed, continuous band of the conductive layer extending along the length of the strip and one or more patterns of a printed circuit communicating with the band;

b) moving the strip having the printed circuit thereon along a predetermined path wherein the strip is first moved through an electrolytic solution past a plurality of anodes disposed in the solution and then over a conductive cathode surface outside the electrolytic solution, the continuous band of the conductive layer on the strip facing the anodes in the solution and engaging the conductive cathode surface; and c) electrically energizing groups of one or more adjacent anodes at different levels wherein each successive group of anodes has a higher energization level than the preceding group.

In accordance with another aspect of the present invention, there is provided a method of forming printed circuits on a non-metallic electrically insulating substrate, comprising the steps of:

a) providing an elongated strip of a flexible non-conductive material having an electrically conductive layer clad thereon;

b) printing a plating resist onto the electrically conductive layer to leave exposed a plurality of patterns and a band connecting each pattern to another to form a continuous exposed area of the conductive layer extending along the length of the strip;

c) moving the strip having the pattern thereon along a predetermined path wherein the strip is first moved through an electrolytic solution past a plurality of anodes disposed in the solution and then over a conductive cathode surface outside the electrolytic solution, the exposed area of the conductive layer on the strip facing the anodes in the solution and engaging the conductive cathode surface; and d) electrically energizing groups of one or more adjacent anodes at different levels wherein each successive group of anodes has a higher energization level than the preceding group.

In accordance with another aspect of the present invention, there is provided a method of forming printed circuits on a non-metallic electrically non-conductive substrate, comprising the steps of:

a) printing a plating resist onto an electrically conductive layer of material on one side of an elongated strip of a flexible nonconductive material to leave exposed a continuous area of the conductive layer along the length of the strip, the area including a plurality of printed circuit patterns;

b) moving the strip having the printed circuits thereon along a predetermined path wherein the strip is first moved through an electrolytic solution past a plurality of anodes disposed in the solution and then over a conductive cathode surface outside the electrolytic solution, the continuous area of the conductive layer on the strip facing the anodes in the solution and engaging the conductive cathode surface; and c) electrically energizing groups of one or more adjacent anodes at different levels wherein each successive group of anodes has a higher energization level than the preceding group.

It is an object of the present invention to provide a method and apparatus for electrodepositing a metal onto a non-metallic electrically insulating substrate.

It is another object of the present invention to provide an apparatus as described above which substantially reduces the electrodepositing time of apparatus known heretofore.

It is another object of the present invention to provide an apparatus as described above which establishes a precise uniform gap between an active anode surface and the moving metallized substrate.

It is another object of the present invention to provide an apparatus as described above including a plurality of anodes which are arranged to define a generally continuous anode surface.

It is another object of the present invention to provide an apparatus as described above having a plurality of anodes, each of which may be separately energized to have a current density different from adjacent anodes.

It is another object of the present invention to provide an apparatus as described above, wherein less electrical power to the apparatus is lost as heat.

It is another object of the present invention to provide an apparatus as described above, wherein anodes are arranged in groups of one or more anodes and the current density applied to the anodes of a particular group is greater than that of an adjacent group.

A still further object of the present invention is to provide an apparatus as described above, wherein depositing metal is utilized as a conductor to increase the current density applied to subsequent anodes.

A still further object of the present invention is to provide an apparatus as described above, wherein current flow from the anode to the web is increased by reducing the spacing therebetween.

It is another object of the present invention to provide a method of depositing metal onto a moving, electrically non-conductive substrate.

It is another object of the present invention to provide a method as described above, wherein the metal deposited on the substrate is used as a cathode.

It is another object of the present invention to provide a method as described above, wherein the current carrying capacity of the deposited metal is used to sequentially increase the current level applied to the moving substrate.

It is another object of the present invention to provide a method as described above, wherein different current levels may be applied simultaneously to different portions of the substrate.

It is another object of the present invention to provide a method as described above, wherein the current levels increase in the direction of travel of the moving substrate.

A still further object of the present invention is to provide a flexible polymer sheet having metal electrodeposited thereon for use in manufacturing flexible electronic circuits.

A further object of the present invention is to provide a flexible polymer/metal sheet as described above, wherein the metal layer is free of lines in cross-section.

A further object of the present invention is to provide a flexible polymer/metal sheet as described above, wherein said sheet has increased flexibility.

A further object of the present invention is to provide a flexible polymer/metal sheet as described above, wherein said sheet has higher elongation properties.

Another object of the present invention is to provide a method and apparatus for continuous fabrication of printed circuits by an electrodeposition process.

These and other objects and advantages will become apparent from the following description of a preferred embodiment taken together with the accompanying drawings.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof and wherein:

FIG. 3 is a first end view of the anode shown in FIG. 2;

FIG. 4 is an elevational view of the anode shown in FIG. 2;

FIG. 5 is an elevational top view of the anode shown in FIG. 2;

FIG. 6 is a second end view of the anode shown in FIG. 2;

DETAILED DESCRIPTION OF PREFERRED EMBODIMENT

Figure 1A:
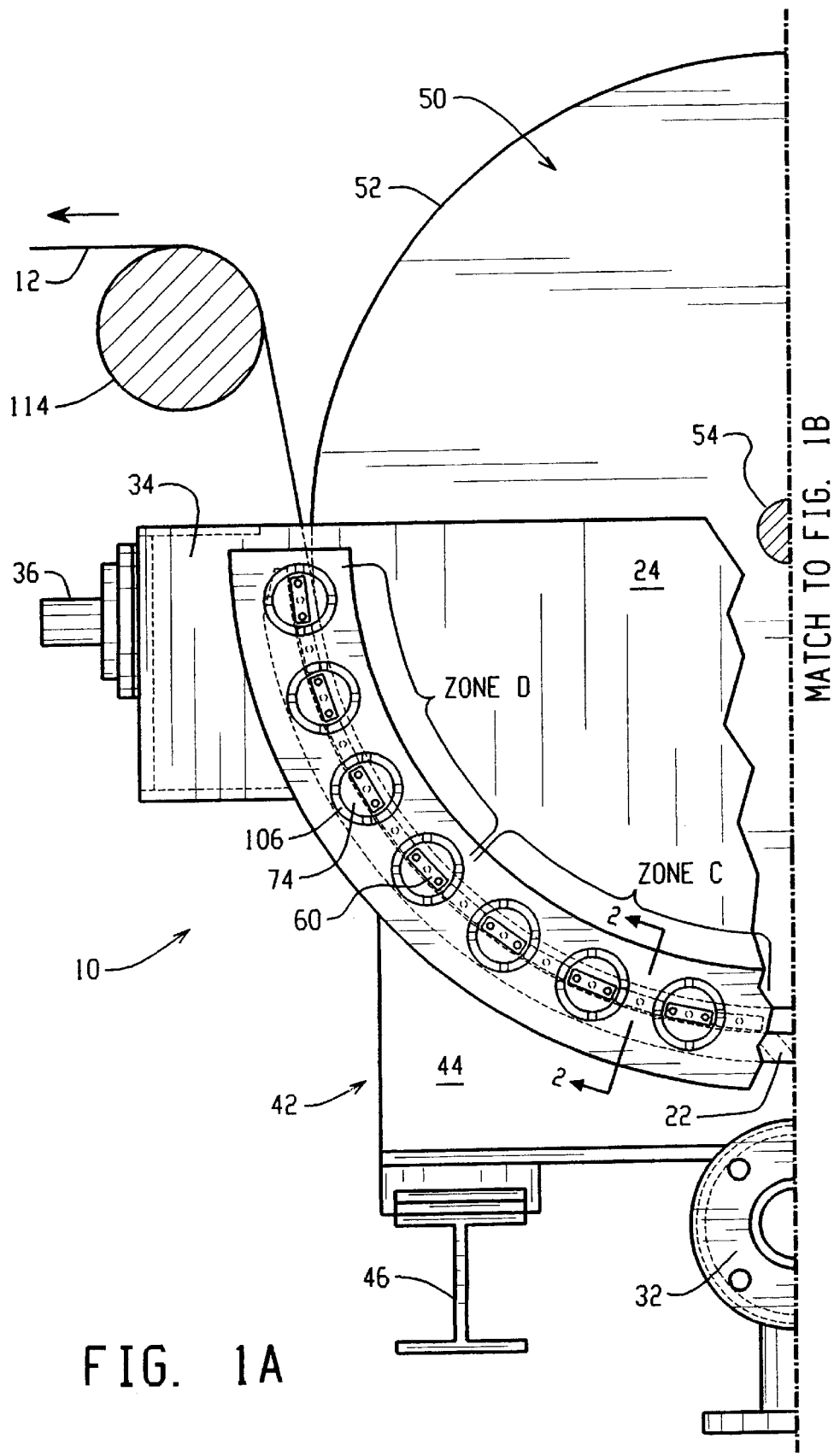
FIGS. 1A and 1B, together, are a partially sectioned end view of an apparatus for electrodepositing metal onto a moving web, illustrating a preferred embodiment of the present invention.

Referring now to the drawing wherein the purpose is for illustrating a preferred embodiment of the invention only, and not for the purpose of limiting same, FIG. 1 shows an electrodepositing apparatus 10 for electrodepositing metal onto a substrate 12. The present invention relates to an apparatus and method for electrodepositing metal onto a non-metallic electrically insulating substrate, preferably, a polymeric film with a flash of metal adhered thereon. The invention will be described with reference to a flexible polymeric sheet ranging in thickness from about 0.5 to about 7 mils. While polymeric films are the preferred substrate for use in the apparatus and method of the present invention, as will be understood from a further reading of the specification, other non-metallic electrically insulating materials may also be used, for example, ceramic tape or 'Green' tape, other fabrics and the like. As used herein, a "flash" of metal is defined as a thin coating of metal ranging from about 500 Angstroms to about 3,000 Angstroms in thickness. Typically, a flash of metal is either sputter coated, electrolessly deposited or deposited by conventional chemical vapor deposition techniques, although other techniques are contemplated.

While the invention is particularly applicable to electrodepositing metal onto a non-metallic electrically insulating polymeric substrate, and will be described with particular reference thereto, it will be appreciated that the invention finds advantageous application in depositing metal on other continuous surfaces.

Figure 2:
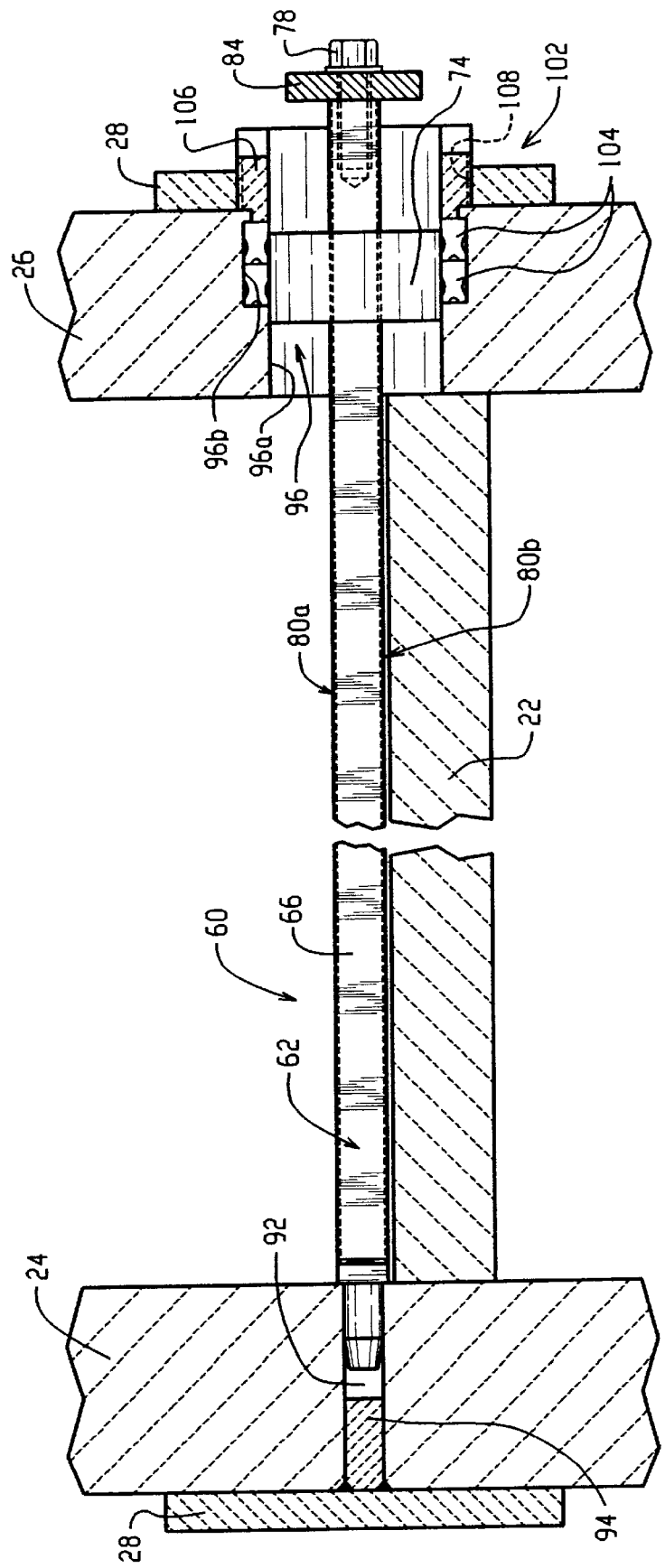
FIG. 2 is an enlarged, sectional view taken along lines 2—2 of FIG. 1 showing a typical anode mounting according to the present invention.

Broadly stated, apparatus 10 is comprised of a tank 20 adapted to hold an electrolytic solution, a drum 50 partially disposed within the electrolytic solution in tank 20, and a plurality of like anodes, designated 60, disposed within tank 20 around drum 50. In the embodiment shown, tank 20 is dimensioned to be generally cylindrical in shape and to conform to cylindrical drum 50. Tank 20 is defined by generally semi-cylindrical bottom wall 22 and two end walls 24, 26, best seen in FIG. 2. An arcuate reinforcing plate 28 is attached to each wall 24, 26, as best seen in FIGS. 1A and 2. Tank 20 defines a semi-cylindrical cavity adapted to receive drum 50 and the electrolytic solution. A supply conduit 32 is provided at the lowermost portion of tank 20 to supply electrolytic fluid to tank 20. Overflow troughs 34 are provided along the upper edges of tank 20 to collect overflowing electrolytic solution and recycle same through ports 36, as is conventionally known. Tank 20 is supported on a support structure 42 comprised of a plurality of transverse webs 44 supported on legs 46.

Drum 50 is cylindrical in shape and, according to the present invention, has a non-conductive outer surface 52. To this end, drum 50 may be formed entirely of a rigid plastic or polymeric material, or be formed of a metal material having an outer casing of a non-conductive material. In the embodiment shown, drum 50 is rotatable upon a shaft 54 which is supported by bearings (not shown) in end walls 24, 26 of tank 20. Drum 50 is preferably rotated by a suitable motor drive (not shown) as is conventionally known in the art, wherein drum 50 may be rotated at a variable circumferential speed to permit substrate 12 to remain in contact with the electrolytic solution within the tank for a sufficient period of time to develop the desired foil thickness, as will be described in greater detail below.

Figure 8:
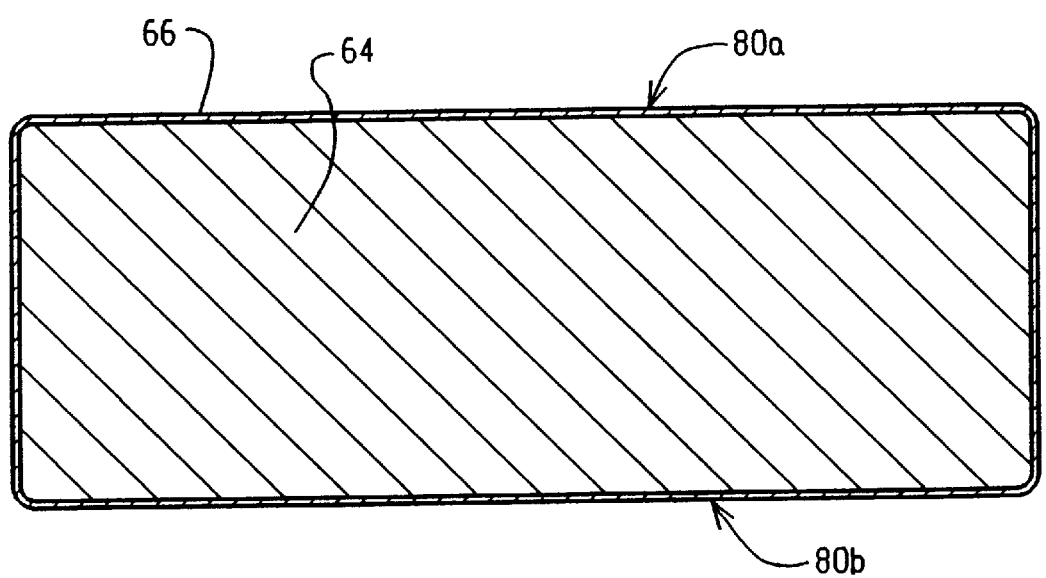
FIG. 8 is a sectional view taken along lines 8—8 of FIG. 5.
Figure 9:
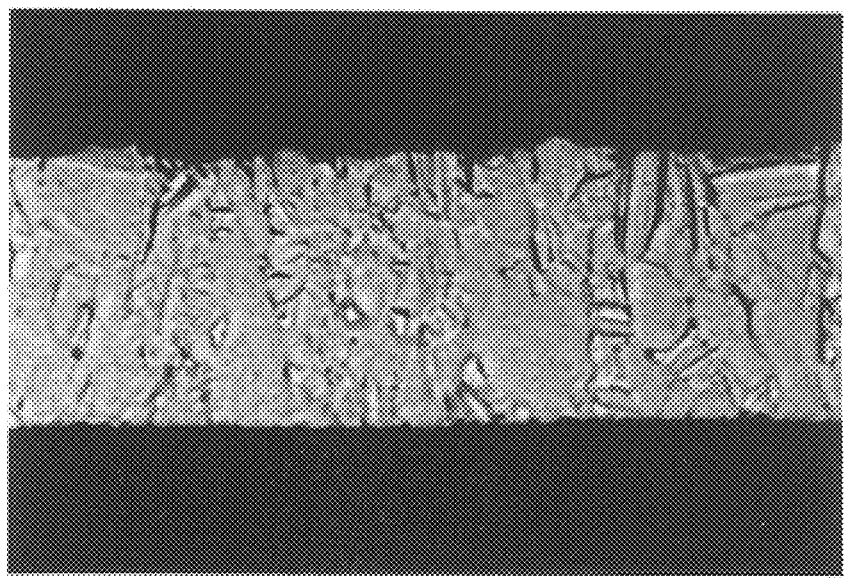
FIG. 9 is a side view optical photomicrograph of an electrodeposited copper foil according to the present invention.

A plurality of like anodes 60 are arranged within tank 20 circumjacent to drum 50. Anodes 60 are preferably elongated bars of uniform prismatic transverse cross-section, each defining a plurality of flat active anode surfaces. In the embodiment shown, anodes 60 are thin bars of uniform rectangular cross-section, as illustrated in FIGS. 3–6. Each anode 60 is comprised of an elongated body 62 having an inner core 64 formed of a highly conductive material and an outer jacket or casing 66 of a conductive metal, which is dimensionally stable in the electrolytic solution, as illustrated in FIG. 8. In the embodiment shown, anode body 62, as heretofore described, is formed to have a core 64 of a copper alloy material and an outer cladding or jacket 66 of titanium. Titanium-clad, copper body 62 of anodes 60 may be formed by a co-extrusion process as is conventionally known in the art. A rectangular plate 68, formed of a material similar to that forming cladding 66, i.e., titanium in the embodiment shown, is attached preferably by welding to one end of body 62 to encase core 64. The rectangular shape of anode 60 defines opposite facing active anode surfaces, designated 80a, 80b, in the drawings. As will be understood from a further reading of the specification, anodes 60 of square or triangular cross-section (not shown) could also be used without deviating from the present invention.

A locating pin 72, aligned with the longitudinal axis of body 62, is provided on plate 68, and a circular collar 74 is provided at the opposite end. Pin 72 and collar 74 are also formed of titanium. Two threaded bores 76 are formed into core 64 at the other end of body 62, i.e., adjacent collar 74. At this end of anode 60, core 64 is exposed.

Figure 1B:
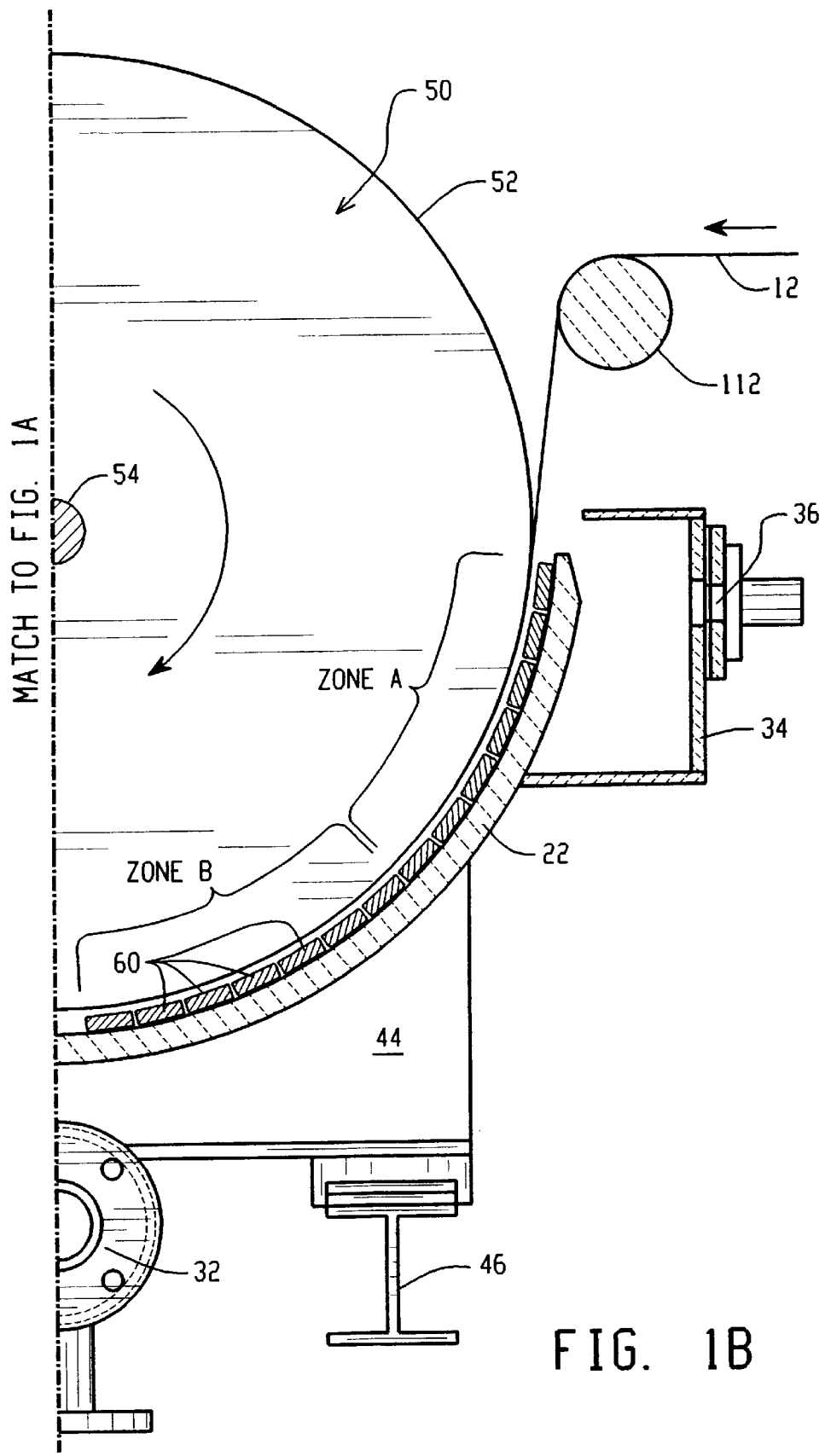

Anodes 60 are arranged side-by-side within tank 20 to form a semi-cylindrical electrical metal forming surface 58 which conforms to surface 52 of drum 50, as best seen in FIG. 1B. More specifically, anodes 60 are arranged side-by-side and extend the length of tank 20. Anodes 60 extend parallel to each other and parallel to the axis of drum 50, and are closely packed, but do not physically touch or contact. Anodes 60 are positioned relative to non-conductive surface 52 of drum 50 to form a uniform gap 90 therewith, which gap 90, according to the present invention, is preferably less than one inch, and more preferably, is approximately three-quarters of an inch. According to another aspect of the present invention, each anode 60 extends through tank 20 along a fixed axis, designated "X" in FIG. 2, and is mounted to, and supported by, at least one of the end walls 22, 24 of tank 20, with one end of anode 60 extending outside of tank 20. In the embodiment shown, anodes 60 are adapted to be positioned within tank 20 as illustrated in FIG. 2. In this respect, the spacing between side walls 22, 24 of tank 20 and the dimensions of anodes 60 are such that the anodes 60 extend through tank 20 between end walls 22, 24, with the ends of anode 60 positioned and supported by end walls 22, 24. Specifically, a plurality of spaced-apart cylindrical bores 92 are formed in end walls 22, 24. Each bore 92 is dimensioned to snugly receive pin 72 on anode 60 as illustrated in FIG. 2. A plug 94 is preferably inserted and welded into the outer end of bore 92 to seal same.

A plurality of spaced apart larger openings 96 are formed in side walls 22, 24 to receive the collared end of anode 60. Each opening 96 includes a first cylindrical portion 96a, dimensioned to snugly receive collar 74 of anode 60, and a second cylindrical portion 96b of larger diameter. Bores 92 and openings 96 are located along a circular center line having its center located along axis "A" of drum 50 so as to position anodes 60 in a semi-circular configuration as indicated above. Bores 92 are disposed along the circular center line at each midpoint between openings 96. The circular center line of each end wall 22, 24 is in axial alignment with the other. In the embodiment shown, an opening 96 in side wall 22 is coaxially aligned with a bore 92 in side wall 24, and vice versa. Thus, in the embodiment shown, adjacent anodes 60 are inserted into tank 20 from opposite ends thereof. In other words, openings 96 and bores 92 on the respective end walls 22, 24 are offset from each other, such that the "pinned end" of one anode 60 is next to the "collared end" of the adjacent anode 60.

A seal arrangement 102 is provided around collar 74 of each anode 60. Seal arrangement 102 is comprised of a pair of annular seals 104 formed of a resilient compressible material which are disposed between collar 74 and the inner surface of second cylindrical portion 96b. A compression ring 106 is threadably received in a threaded bore 108 in plate 28. Seals 104 are compressed by compression ring 106 to form a fluid-tight seal between collar 74 of anode 60 and the inner surface of second cylindrical portion 96b of bore 96. Importantly, anodes 60 are symmetric about axis "X," which enables them to be positioned within tank 20 with either anode surface 80a or 80b facing drum 50.

Figure 7:
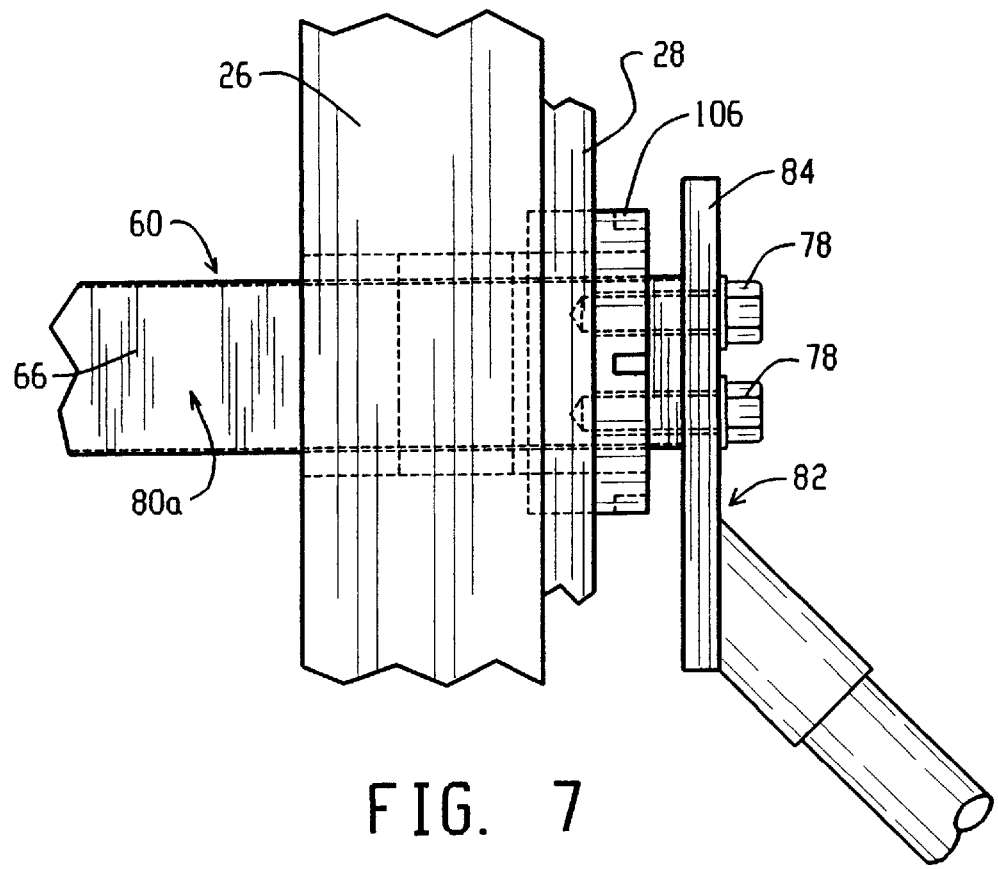
FIG. 7 is an enlarged view of one end of the anode shown in FIG. 2 showing an electrical connector attached thereto.

As shown in FIG. 2, when mounted within tank 20, a portion of anode 60, i.e., that portion beyond collar 74 extends outside tank 20. An electrical connector 82 is attached to the end of anode 60, as best seen in FIG. 7. Connector 82 includes a flat plate portion 84 having spaced-apart apertures therethrough. The apertures in plate 84 are dimensioned to be in registry with bores 76 in core 64 of anode 60. Bores 76 are dimensioned to receive threaded fasteners or lugs 78. Fasteners or lugs 78 are adapted to attach plate 84 of electrical connector 82 to anode 60. Each connector 82 is connectable to a power source (not shown). Importantly, plate 84 of connector 82 is in direct contact with the copper core 64 of anode 60.

A guide roller 112 is provided at the inlet side of apparatus 10 to position an incoming substrate 12 relative to drum 50. A cathode pick-up roller 114 is provided at the outlet side of apparatus 10, above and outside of tank 20 and the electrolytic solution contained therein. Cathode pick-up roller 114 is positioned to engage the metal side of the substrate 12 and to be in electrical contact therewith as it exits tank 20. Cathode pick-up roller 114 is electrically conductive and designed to be able to conduct the maximum current which can be applied to anodes 60, as will be discussed in greater detail below.

Referring now to the operation of apparatus 10 and a method of electrodepositing metal on a moving substrate, a polymeric substrate 12 with the adhered flash of metal is introduced into an electrodeposition apparatus 10, such that the metal flash on substrate 12 is exposed to the electrolytic bath in tank 20 while the other side of the substrate 12 is positioned on the electrically nonconductive outer surface 52 of drum 50. Practically any flexible polymeric sheet and preferably thermoplastic sheets may be used as long as a conductive flash of metal may be adhered to the surface of the flexible polymeric sheet. Illustrative of such polymeric sheets are, polyimide sheets (Kapton®, E.I. DuPont) or polyester sheets sputtered with about 2,000 Angstroms of metal such as tin, brass, zinc, copper, chromium or the like.

Substrate 12 is passed over guide roller 112 and onto drum 50. Substrate 12 is advanced on drum 50 through the electrolytic solution within tank 20. Substrate 12 passes through gap 90 defined between drum 50 and anodes 60, with the flash metal thereon facing the active anode surfaces 80 of anodes 60. Substrate 12 exits the electrolytic solution over cathode pick-up roller 114, wherein the metallized side of substrate 12 is in contact with roller 114. The flash of metal adhered to substrate 12 thereby acts as a cathode during the electrodeposition process as current is furnished to anodes 60.

According to the present invention, anodes 60 are energized in groups containing one or more anodes 60, wherein each successive group of anode(s) 60, in the direction of travel of substrate 12, has a higher energization level than the preceding group. As metal is deposited onto the initial flash of metal on substrate 12 by the initial groups of anode(s) 60, the increased current carrying capacity of the thicker metal is utilized to allow subsequent groups of anodes to have higher energization levels, the thicker metal acting as a conductor to cathode pick-up roller 114 and allowing higher levels of energization. In other words, the metal flash on substrate 12 is initially used as an electrical conduit to cathode pick-up roller 114 to build up, i.e., deposit, metal onto substrate 12. The ever increasing thickness of the metal on substrate 12, and its increasing current carry capacity, is then used to increase the electrodeposition of metal by continually stepping up, i.e., increasing, current to the subsequent groups of anode(s) 60 based upon the current carrying capacity of the metal accumulated up to the preceding group of anode(s) 60. It will, of course, be appreciated that the original flash metal on polymeric substrate 12 has limited current-carrying capacity, and therefore, the different current levels cannot immediately or instantaneously be applied to several groups of anode(s) 60. Initially, the current density which can be applied to substrate 12 is limited by the current-carrying capacity of the metal flash, i.e., the current it can conduct to cathode pick-up roller 114. Excessive current densities applied to anodes 60 will, in effect, merely blow the thin flash metal off of polymeric substrate 12. Accordingly, it is necessary to gradually build up the metal thickness on substrate 12 by sequentially energizing the groups of anode(s) 60.

Specifically, the first group of anode(s) 60, i.e., the group first encountered by substrate 12 entering tank 20, will be energized at a level which the flash metal layer on polymeric substrate 12 can handle. This first group of anodes would thus deposit metal from the electrolytic solution onto the flash metal, thereby building up the thickness of the metal on polymeric substrate 12. As substrate 12 is moved at a predetermined speed through the electrolytic solution in tank 20, a continuous layer of built-up metal will eventually reach the cathode pick-up roller 114 thereby increasing the current carrying capacity which can be applied to substrate 12. At this time, the second group of anode(s) 60 may be energized at an energization level higher than said first group of anodes. The level of energization of this second group would be based upon the current carry capacity of the metal built up by the first group of anode(s) 60. The metal deposited by the first group of anode(s) 60 is thus used as a conductor to enable higher current levels to be applied to substrate 12 and to be conducted to the cathode pick-up roller 114. After a predetermined period of time, the built-up metal deposited by both the first group of anode(s) 60 and the second group of anode(s) 60 will reach the cathode pick-up roller 114. The metal deposited by the first group of anode(s) 60 and the second group of anode(s) 60, provides sufficient thickness to energize a third group of anode(s) 60 at a higher level of energization than the first two groups of anode(s) 60. Again, the added build-up created by this third group of anode(s) 60, which is depositing metal onto metal applied by the first and second groups of anode(s) 60, eventually reaches the pick-up cathode which enables a fourth group of anode(s) 60 to be energized at a level higher than the first three groups. In this respect, each group of anode(s) 60 basically builds up the metal-carrying capacity of substrate 12 to enable a subsequent group of anode(s) 60 to apply higher levels of energization to the subsequent anode(s) 60 and thus produce higher electrodeposition rates occur in the subsequent groups. Eventually, by the foregoing sequential energization, each group of anode(s) 60 of apparatus 10 can be energized at its desired operating level.

As used heretofore the phrase "group of anode(s) 60" is intended to indicate that each group of anode(s) 60 may be comprised of one or more anodes 60. In this respect, the design of apparatus 10 permits each anode 60 to be connected to its own separate power source, i.e., rectifier.

Specific embodiments of the present invention will now be illustrated by the following examples which are exemplary only, where it is not intended for the invention to be so limited. Various modifications in process parameters, materials, technique and operation will be apparent to one of ordinary skill in the art. All parts and percentages specified in the Examples are by weight unless otherwise specified.

Although the present invention may find advantageous application for the electrodeposition of many metals, including but not limited to, copper, gold, silver, nickel, tin, zinc, brass, chromium, platinum and tungsten, copper is the metal typically used for electronic applications. Copper's high electrical conductivity, solderability, and ease of electroplating make copper the most preferred metal.

For effective copper electrodeposition to occur, sufficient amounts of copper (generally as copper sulfate salts), chlorides and sulfuric acid must be present in the electrodeposition bath. In accordance with the present invention, the electrolytic solution includes copper sulfate in the range of from about 50 to about 80 g/l, chloride ion in the range of from about 0 to about 30 ppm and sulfuric acid in the range of from about 50 to about 70 g/l. The temperature of the bath is also a parameter which may affect the performance of the electrodeposition process. In this respect, a typical temperature operating window ranges from about 20° C. to about 95° C. According to the present invention, the preferred temperature range extends from about 35° C. to about 80° C., and the most preferred range extends from about 50° C. to about 70° C.

The following examples are based upon use of an apparatus as heretofore described and shown in the drawings. As shown in FIG. 1, twenty-eight (28) anodes 60 are provided within tank 20. Anodes 60 are banked or grouped together into groups of seven (7) anodes 60, wherein each anode group is connected to its own separate power source. Specifically, the seven anodes 60 of each group are connected to one rectifier resulting in the same current sent to each anode of a particular group. The four anode groups define "treatment zones" designated "A," "B," "C" and "D" in the drawings. In the following examples, drum 50 was made of rubber and was twenty-six (26) inches long and thirty (30) inches in diameter. A 3 mil thick Kapton® polymer sheet sputter-coated with about 2,000 Angstroms of copper was used. The polymer sheet was fourteen (14) inches wide. The aqueous electrodeposition bath was comprised of:

| 1) | copper sulfate pentahydrate | 400 | g/l |
| 2) | sulfuric acid | 65 | g/l |
| 3) | chlorides | 25 | ppm. |

The temperature of the bath was kept between approximately 55° C. to approximately 65° C.

As will be appreciated by those skilled in the art, the ultimate thickness of the electrodeposited copper will depend upon the line speed of the apparatus, i.e., the speed of the substrate through zones A–D, as well as upon the current density furnished to the electrolytic bath by anodes 60.

The following examples show the apparatus heretofore described operating at different "line speeds" and at different energization levels to anodes 60.

EXAMPLE 1

(Substrate Speed 3.15 ft/min)

|  | Zone A | Zone B | Zone C | Zone D |
| --- | --- | --- | --- | --- |
| Length (inches) | 10.500 | 10.500 | 10.500 | 10.500 |
| Amps/Zone | 150 | 150 | 150 | 150 |
| Time/Zone (secs) | 16.667 | 16.667 | 16.667 | 16.667 |
| Zone Current Density (amps/ft$^2$) | 146.939 | 146.939 | 146.939 | 146.939 |
| Cu Weight (grams) | 0.825 | 1.650 | 2.474 | 3.299 |
| Cu Thick (mils) | 0.039 | 0.078 | 0.117 | 0.156 |
| Web Current Density (amps/in$^2$) | 274793 | 274793 | 274793 | 274793 |

EXAMPLE 2

(Substrate Speed 2.6 ft/min)

|  | Zone A | Zone B | Zone C | Zone D |
| --- | --- | --- | --- | --- |
| Length (inches) | 10.500 | 10.500 | 10.500 | 10.500 |
| Amps/Zone | 150 | 400 | 660 | 840 |
| Time/Zone (secs) | 20.192 | 20.192 | 20.192 | 20.192 |
| Zone Current Density (amps/ft$^2$) | 146.939 | 391.837 | 646.531 | 822.857 |
| Cu Weight (grams) | 0.999 | 3.664 | 8.061 | 13.657 |
| Cu Thick (mils) | 0.047 | 0.173 | 0.381 | 0.646 |
| Web Current Density (amps/in$^2$) | 226814 | 226814 | 226814 | 226814 |

EXAMPLE 3

(Substrate Speed 1.6 ft/min)

|  | Zone A | Zone B | Zone C | Zone D |
| --- | --- | --- | --- | --- |
| Length (inches) | 10.500 | 10.500 | 10.500 | 10.500 |
| Amps/Zone | 270 | 500 | 900 | 900 |
| Time/Zone (secs) | 32.813 | 32.813 | 32.813 | 32.813 |
| Zone Current Density (amps/ft$^2$) | 231.429 | 489.796 | 881.633 | 881.633 |
| Cu Weight (grams) | 2.557 | 7.970 | 17.713 | 27.456 |
| Cu Thick (mils) | 0.121 | 0.377 | 0.837 | 1.298 |
| Web Current Density (amps/in$^2$) | 159517 | 145976 | 142457 | 141435 |

In the tables set forth above, "Amps/Zone" indicates the total current applied to a particular zone. "Time/Zone" indicates the time (in seconds) the substrate is exposed to a particular zone. "Zone Current Density" indicates the measured current density at the active anode surfaces of a particular zone. "Cu Weight" indicates the cumulative weight of copper in ounces deposited on substrate 12 after a particular zone. "Cu Thick" indicates the cumulative thickness of copper in mils deposited on substrate 12 after a particular zone. "Web Current Density" indicates the current density flowing in the web, i.e., flowing through the metal on substrate 12.

A comparison of the tables show the effect of "line speed" and "current density" on the ultimate thickness of the electrodeposited copper, and show the advantages of the present invention.

In Example 1, substrate 12 was moved at a speed of 3.15 ft/min through apparatus 10. At this speed, substrate 12 was exposed to each zone for about 16.7 seconds. In Example 1,150 amps were applied to each zone. In this respect, each anode in each zone was energized with approximately 21 to 22 amps of current. The current density per zone was about 146.9 amps. In this respect, the difference between the current applied to each zone and that actually present at the anode surface is very slight. In other words, little energy was dissipated or lost as heat. Under these operating conditions, the build-up of copper was almost proportional. In other words, each zone added approximately 0.825 grams of copper to substrate and increased the thickness by 0.039 mils. The actual current density through the metal built up on the substrate 12 as detected by cathode element 114 was about 274, 793 amps. As would be expected with the current to each zone being identical, the build-up of copper on substrate 12 was uniform and similar for each zone.

Example 2 illustrates operating conditions wherein the speed of substrate 12 was about 2.6 ft/min, and the current applied to each zone increased in subsequent zones. In this respect, 150 amps were applied to Zone A, 400 amps were applied to Zone B, 660 amps were applied to Zone C, and 840 amps were applied to Zone D. At the identified operating speed, substrate 12 was exposed to each zone for approximately 20.2 seconds. Under these conditions, the build-up of copper on substrate 12 is dramatically increased. As shown in Example 2, 0.999 grams of copper are deposited on substrate 12 in Zone A. At the end of Zone B, the weight of the copper is increased to 3.664 grams. At the end of Zone C, the weight of the copper increased to 8.061 grams with a thickness of 0.381 mils. By the time substrate 12 exited Zone D, 13.657 grams of copper had been deposited to produce a copper thickness of 0.646 mils.

In Example 3, the line speed has been reduced to 1.6 ft/min. At this speed, substrate 12 is exposed to each zone for 32.813 seconds. In this Example, 270 amps were applied to Zone A, 500 amps were applied to Zone B, and 900 amps were applied to Zones C and D. Even at these high levels of current distribution, the actual current density at the active anode surfaces is relatively close to that applied to each of the zones. In this respect, less than two percent of the power applied to the anodes 60 is lost as heat due to the configuration and operating characteristics of the present invention. In Example 3, 2.557 grams of copper were electrodeposited to substrate 12 in Zone A to build up substrate 12 with 0.121 mils of copper. After Zone B, 7.970 grams of copper had been electrodeposited onto substrate 12, which then had a copper thickness of 0.377 mils. At the end of Zone C, 17.713 grams of copper had been deposited on substrate 12 to produce a thickness of 0.873 mils. By the time substrate 12 exited Zone D, 27.456 grams of copper had been deposited thereon with a final thickness of about 1.3 mils.

As shown in Example 3, at a slower line speed, the build-up of copper on substrate 12 increases dramatically per zone, and with this increase in copper, substantially higher current can be applied to substrate 12 to further increase the electrodeposition process.

The present invention results in, e.g., a copper coating which has little or no edge effects, i.e., the copper coating is uniform in thickness throughout the body of the coating and along its edges. Further advantages of copper electrodeposited by the method described herein are the improvements in physical properties. Elongations for one ounce copper foil in excess of fifteen percent represent one such improvement. This improvement represents approximately a factor of three times greater elongation as compared to conventionally electrodeposited one ounce copper foil on flexible polymeric substrates. Additionally, the electrodeposited copper, in accordance with the present invention, exhibits improved ductility thereby minimizing the tendency of the copper to crack or fail during processing or use.

Among other advantages realized from this invention are the superior properties of the final product produced. One advantage being that electrodeposited copper foil produced by the process and apparatus of the present invention exhibits substantially greater ductility than that of conventionally electrodeposited copper foils. Per cent elongations, for example, of about 28 per cent have been measured for one ounce copper foils. Also, as previously mentioned, the electrodeposited copper metal exhibits no edge effects, and in turn, the thickness of the electrodeposited copper is substantially uniform over the entire area of plated copper.

It is believed that the enhanced elongation and greater ductility of the metal coated, polymeric films of the present invention result from the uniform build-up of electrodeposited metal. In contrast to conventional methods, which typically require several passes through a plurality of electrolytic baths, the process of the present invention does not expose each metallic layer to the air. The layer of electrodeposited metal is uniform, continuous and does not have any striation regions, i.e., identifiable layer of metal. Thus, there are not regions of the electrodeposited metal of the present invention that contain metallic oxides or airborne contaminates, either of which could result in embrittled layers or regions of high stress concentrations. Hence, the initiation of cracks in the electrodeposited metal of the present invention is less likely to occur as in conventionally made, electrodeposited, metallic coated, polymeric films.

Figure 10:
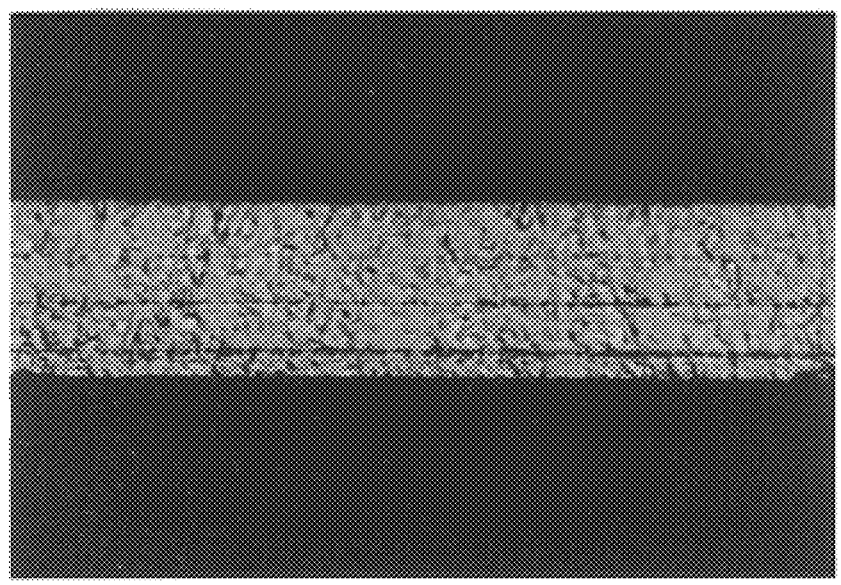
FIG. 10 is a side view optical photomicrograph of a commercially electrodeposited copper foil on a polymer substrate and showing the different layers of copper deposited according to a commercial process known heretofore.
Figure 11:
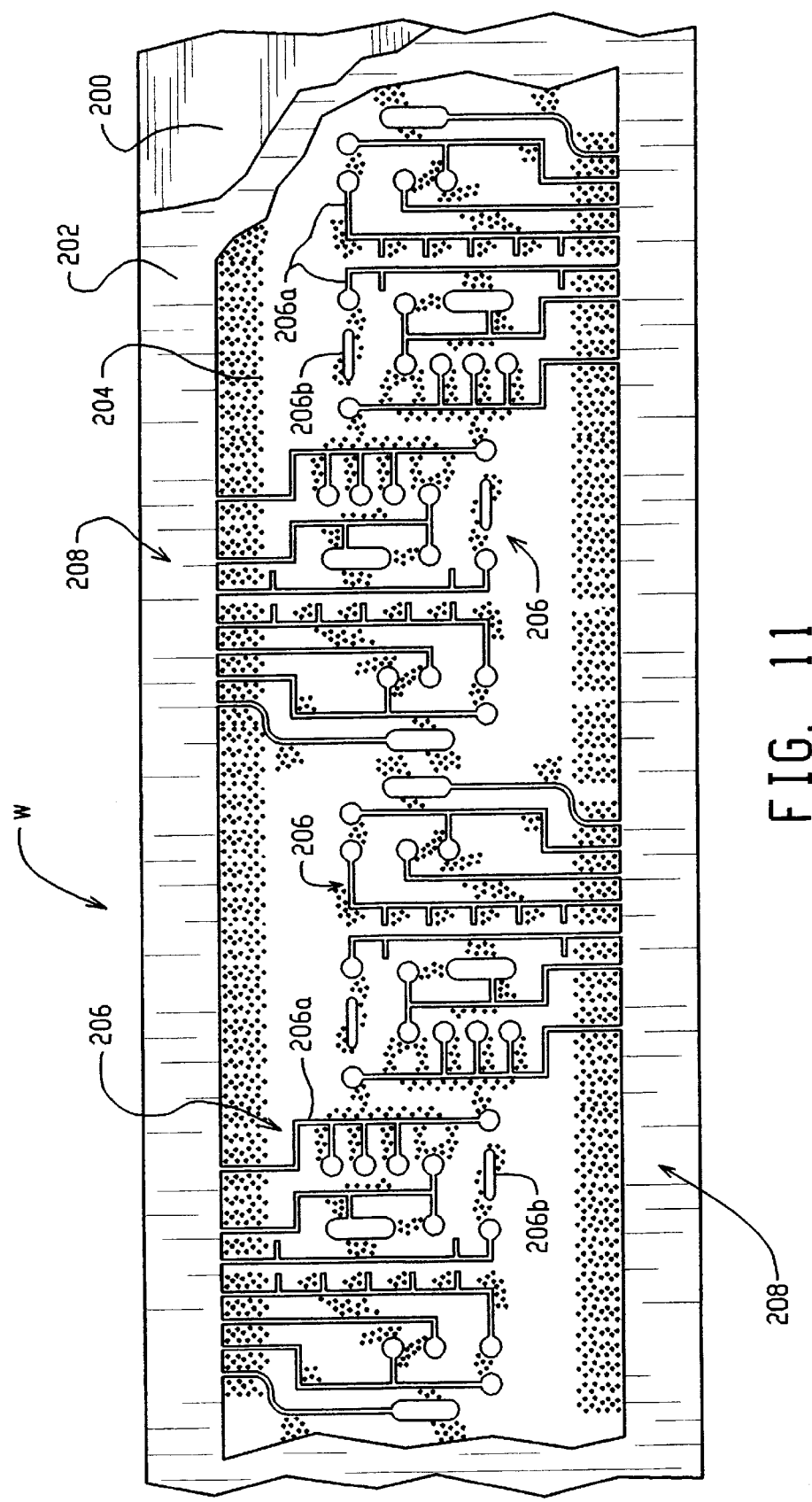
FIG. 11 is a top plan view of a web having a metal layer masked to define circuit patterns, illustrating another aspect of the present invention.

FIG. 10 shows a side view optical photomicrograph of an electrodeposited copper foil on Kapton® produced according to the process of Example 1. This photomicrograph shows a single uniform, continuous layer of copper metal on substrate 12. This is to be contrasted with the photomicrograph of FIG. 11. FIG. 11 is a side view optical photomicrograph of a conventional product produced by a typical commercial electroplating process. FIG. 11 clearly shows the different layers of copper metal deposited on the substrate. Each striation corresponds to the end of one electrodeposition cycle and the beginning of the next electrodeposition cycle in a multiple bath apparatus. These striated regions will, most likely, be regions of high stress concentrations.

Figure 12A:
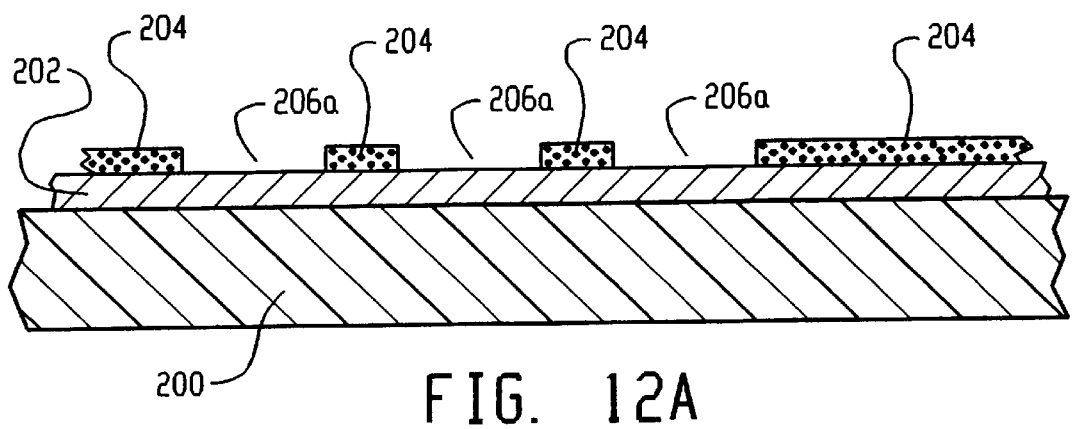
FIG. 12a is an enlarged sectional view schematically illustrating a web prior to a metal deposition process according to the present invention.
Figure 12B:
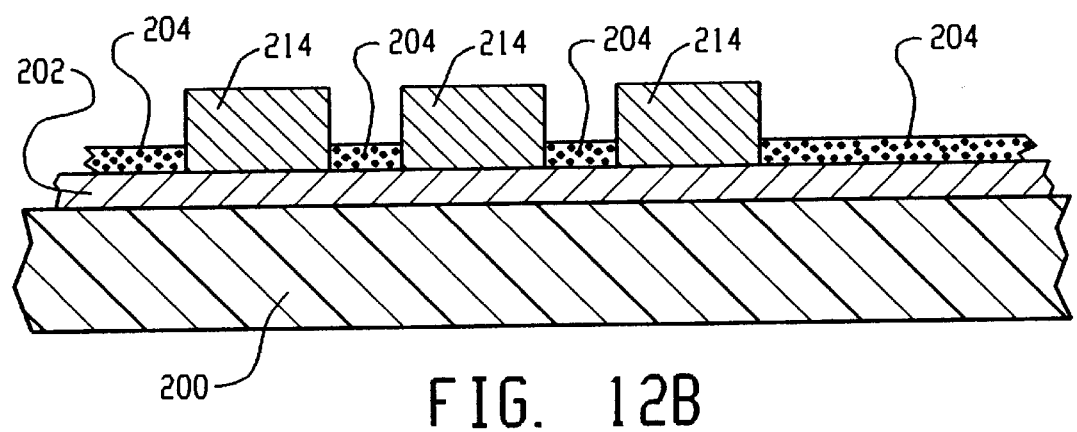
FIG. 12b is an enlarged sectional view of the web shown in FIG. 12a illustrating a metal build-up according to the present invention.
Figure 13:
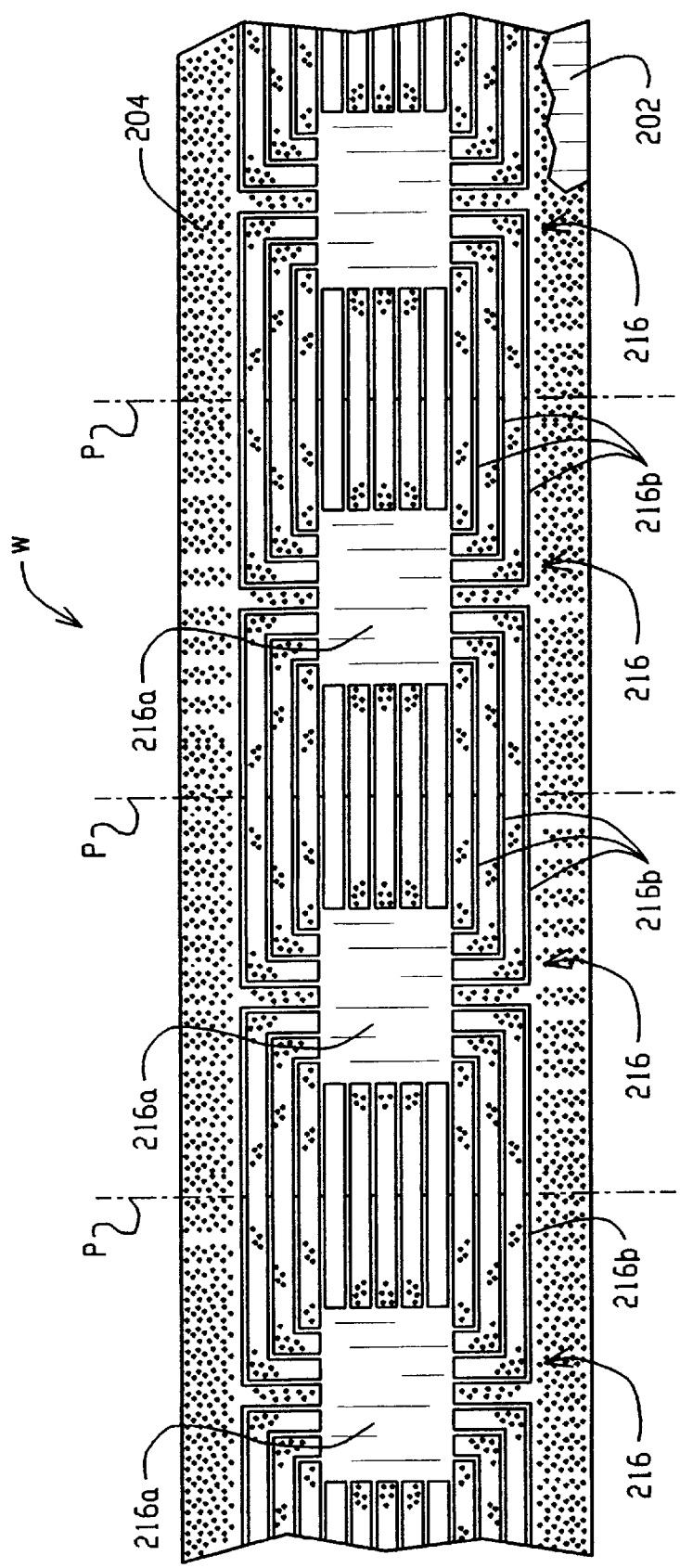
FIG. 13 is a top plan view of a web having a metal layer masked to define a plurality of like circuit patterns connected to extend along the length of the web.

The invention has heretofore been described with respect to electrodepositing metal onto a non-conductive polymeric web, which web is later used in forming flexible electronic circuits. According to another aspect of the present invention, apparatus 10 may be used to plate printed circuit patterns directly onto the moving web, as shown in FIGS. 11–13 wherein the web is designated "W." According to this aspect of the present invention, web W is generally comprised of a thin, flexible strip or film 200 of a non-conductive material which is clad on one side with a thin layer 202 of metal, as best seen in FIGS. 11–12b. The metal clad side of film 200 is masked with a plating resist masking material 204, by conventionally known techniques, to define a plurality of circuit patterns 206. Patterns 206 are defined by exposed, unmasked areas of the base metal layer 202. In the embodiment shown in FIG. 11, the central portion of web W is masked such that a continuous band 208 of exposed, unmasked base metal 202 extends along each edge of web W. The exposed, unmasked areas of base metal layer 202 forming each pattern 206 communicate with the exposed, unmasked areas of base metal 202 forming bands 208. In the embodiment shown in FIG. 11, the orientation of adjacent patterns 206 are inverted such that adjacent patterns 206 extend toward an opposite edge of web W.

Strip 200 may be formed of any flexible, non-conductive material and layer 202 thereon may be any platable metal. A plastic or polymeric film of a few mils thickness having approximately seventeen hundred (1,700) angstroms (Å) of metal applied thereon has provided satisfactory results in plating patterns according to the present invention. While any platable metal may be used, metal layer 202 is preferably copper. Importantly, circuit patterns 206 are generally formed such that every branch 206a or portion thereof communicates with a band 208. As will be described in greater detail below, small portions of circuit pattern 208 may be totally isolated from the continuous branches or legs of patterns 206. FIG. 12A generally shows a cross-sectional view of web W of FIG. 11, illustrating non-conductive polymeric film or strip 200, layer 202 of metal, and the plating resist masking material 204 defining branches 206a of patterns 206.

Referring now to the process of forming circuit patterns 206, web W is introduced into apparatus 10 in a manner as generally illustrated in FIGS. 1A and 1B. Specifically, web W is passed over guide roller 112 and onto drum 50 and is advanced on drum 50 through the electrolytic solution within tank 20. In this respect, web W passes through gap 90 defined between drum 50 and anodes 60 with circuit patterns 206 (i.e., the exposed, unmasked areas of the base metal layer 202) facing the active anode surfaces 80 of anodes 60. Web W exits the electrolytic solution over cathode pickup roller 114, wherein the exposed portions of metal layer 202 are in contact with roller 114, such that the exposed metal of layer 202 acts as a cathode during the electrodeposition process when current is furnished to anodes 60.

In the manner as previously described, anodes 60 are energized in groups containing one or more anode(s) 60, wherein each successive group of anode(s) 60 in the direction of travel of web W, has a higher energization level than the preceding group. As will be appreciated, as metal is deposited onto the exposed portions of metal layer 202 forming patterns 206 and bands 208, the increased current carrying capacity of this thicker metal is utilized to allow subsequent groups of anodes to have higher energization levels. In this respect, because patterns 206 have continuous branches 206a communicating with bands 208, a continuity exists along the length of the web which enables greater current to be conducted through the circuit branches 206a and through the bands 208 to cathode pickup roller 114. Because of the continuity of the metal in circuit patterns 206 and bands 208, the current levels to subsequent zones may be increased to higher levels, thereby increasing the plating of metal to form circuit patterns 206. As indicated above, patterns 206 may include small isolated areas, designated 206b in the drawings, not in direct communication with branches 206a of circuit patterns 206 or bands 208. With respect to these areas, it is believed that the underlying layer 202 of metal, i.e., the areas of layer 202 below plating resist 204, may provide sufficient current carrying capacity to conduct the increased current levels to branches 206a and bands 208 so as to enable the buildup of metal on these small areas without burning or destroying web W. In this respect, because most of the current applied to web W by anodes 60 will be conducted to cathode 114 through branches 206a of pattern 206 and through bands 208, the large area of base metal layer 202 beneath masking material 204 may be sufficient to dissipate the current to the built-up areas of pattern branches 206a and bands 208 and enable area 206b to withstand higher current levels. As will be appreciated, however, it is the continuity and increased current carrying capacity of metal built up on branches 206a and bands 208 which allow higher energization levels to be applied to subsequent zones of apparatus, and that areas 206*b* can make up only a relatively small area of the total exposed metal layer 202.

FIG. 12B schematically illustrates how metal is built up in the exposed, unmasked portions of base metal layer 202. In FIG. 13B, the built-up metal is designated 214. After circuits 206 have been built up to a desired thickness, masking material 204 may be removed by conventionally known methods to expose the built-up copper pattern extending from base metal layer 202. The base layer 202 is then removed by an etching process, leaving the desired pattern 206 of built-up copper on film 200. Copper bands 208 may then be removed (i.e., separated) from patterns 206 to leave exposed patterns 206 on film 200.

FIG. 13 shows an alternate embodiment of web W wherein a plurality of like patterns 216 are centrally positioned on web W to be in communication with each other to form continuous band of patterns 216. Each pattern 216 includes a central portion 216*a* having a plurality of legs or branches 216*b* extending therefrom. Pattern 216 is generally symmetrically, and adjacent patterns 216 are arranged such that legs 216*b* of adjacent patterns 216 communicate with each other. In FIG. 13, a parting line, designated "P," designates and identifies separate patterns 216. This arrangement of patterns 216 creates a continuous path of exposed metal 202 along web W. This continuity of exposed metal is utilized, in the manner as described above, to facilitate the application of increased current to web W. Specifically, metal deposited onto patterns 216 by an initial group of anode(s) 60, provides web W with additional current carrying capacity, allowing subsequent groups of anodes 60 to have higher energization levels. As will be appreciated from the foregoing description, it is necessary that a continuity of exposed metal exists along web W to conduct the current applied by anodes 60 through web W to the cathode pickup roller 114.

After the patterns 216 have been built up in accordance with the present invention, the masking material 204 and base metal layer 202 are removed by conventionally known methods to expose copper patterns formed by the deposited metal. Patterns 216 are then separated from each other along parting line "P" to form separate individual circuits.

The present invention thus provides a method of forming circuit patterns on a flexible non-conductive polymeric strip, which method in addition to reducing the forming time provides a circuit having improved elongation and flexibility.

The present invention has been described with reference to preferred embodiments. Other modifications and alterations will occur to those skilled in the art upon reading and understanding the specification. It is intended that all modifications and alterations be included insofar as they come within the scope of the appended claims or equivalents thereof.

Having described the invention, the following is claimed:

1. An anode for use in an electrolytic cell containing electrolytic solution, said anode comprising:

an elongated, straight copper bar of uniform, transverse cross-section having a central axis extending lengthwise through said bar;

a uniform, thin layer of a conductive metal encasing the length of said copper bar, said layer being formed of a conductive metal that is inert to said electrolytic solution;

at least two, flat continuous active anode surfaces extending along the length of said bar defined along the surface of said conductive metal;

first mounting means at a first end of said elongated bar comprised of a pin aligned with axis of said bar, and second mounting means near a second end of said bar comprised of said cylindrical collar; and a portion of said bar extending beyond said cylindrical collar having connection means for connecting said bar to an electrical power source.

2. An anode as defined in claim 1, wherein said conductive layer is titanium.

3. An anode as defined in claim 1, wherein said anode is formed of a co-extruded titanium-clad copper bar.

4. An anode as defined in claim 1, wherein said anode has a rectangular cross-section.

* * * * *